United States Patent
Shibib et al.

(10) Patent No.: US 10,833,063 B2
(45) Date of Patent: Nov. 10, 2020

(54) HIGH ELECTRON MOBILITY TRANSISTOR ESD PROTECTION STRUCTURES

(71) Applicants: Muhammad Ayman Shibib, San Jose, CA (US); Chungchi Gina Liao, Los Altos, CA (US)

(72) Inventors: Muhammad Ayman Shibib, San Jose, CA (US); Chungchi Gina Liao, Los Altos, CA (US)

(73) Assignee: Vishay Siliconix, LLC, San Jose, CA (US)

( * ) Notice: Subject to any disclaimer, the term of this patent is extended or adjusted under 35 U.S.C. 154(b) by 0 days.

(21) Appl. No.: 16/044,835

(22) Filed: Jul. 25, 2018

(65) Prior Publication Data

US 2020/0035666 A1    Jan. 30, 2020

(51) Int. Cl.
*H01L 21/00* (2006.01)
*H01L 27/02* (2006.01)
*H01L 29/20* (2006.01)
*H01L 29/66* (2006.01)
*H01L 29/778* (2006.01)

(52) U.S. Cl.
CPC ...... *H01L 27/0255* (2013.01); *H01L 29/2003* (2013.01); *H01L 29/66462* (2013.01); *H01L 29/778* (2013.01)

(58) Field of Classification Search
None
See application file for complete search history.

(56) References Cited

U.S. PATENT DOCUMENTS 5,923,513 A  7/1999  Pelly
6,069,782 A  5/2000  Lien et al.
(Continued)

FOREIGN PATENT DOCUMENTS

EP  2779246     9/2014
EP  2779246 A2  9/2014
WO  2005070009  8/2005

OTHER PUBLICATIONS

Lee, Finella; The Effects of Gate Metals on the Performance of p-GaN/AlGaN/GaN High Electron Mobility Transistors.
(Continued)

*Primary Examiner* — Reema Patel

(57) ABSTRACT

A multi-gate High Electron Mobility Transistor (HEMT) can include a Two-Dimension Electron Gas (2DEG) channel between the drain and the source. A first gate can be disposed proximate the 2DEG channel between the drain and source. The first gate can be configured to deplete majority carriers in the 2DEG channel proximate the first gate when a potential applied between the first gate and the source is less than a threshold voltage associated with the first gate. A second gate can be disposed proximate the 2DEC channel, between the drain and the first gate. The second gate can be electrically coupled to the drain. The second gate can be configured to deplete majority carriers in the 2DEG channel proximate the second gate when a potential applied between the second gate and the 2DEG channel between the second gate and the first gate is less than a threshold voltage associated with the second gate. The threshold voltage associated with the second gate can be equal to or greater than the threshold voltage associated with the first gate.

23 Claims, 3 Drawing Sheets

(56) References Cited

U.S. PATENT DOCUMENTS

| | | |
|---|---|---|
| 6,411,485 B1 | 6/2002 | Chen et al. |
| 7,544,545 B2 | 6/2009 | Chen et al. |
| 7,583,485 B1 | 9/2009 | Luo et al. |
| 7,642,164 B1 | 1/2010 | Xu et al. |
| 7,781,894 B2 | 8/2010 | Oikawa |
| 7,816,764 B2 | 10/2010 | Marchand et al. |
| 7,851,825 B2 | 12/2010 | Suh et al. |
| 7,898,004 B2 | 3/2011 | Wu et al. |
| 7,985,986 B2 | 7/2011 | Heikman et al. |
| 8,039,352 B2 | 10/2011 | Mishra et al. |
| 8,049,252 B2 | 11/2011 | Smith et al. |
| 8,114,717 B2 | 2/2012 | Palacios et al. |
| 8,269,019 B2 | 9/2012 | Heiser et al. |
| 8,367,500 B1 | 2/2013 | Xu et al. |
| 8,390,027 B2 | 3/2013 | Iwamuro |
| 8,582,258 B1 | 11/2013 | Luo et al. |
| 8,587,033 B1 | 11/2013 | Rieger et al. |
| 9,083,175 B2 | 7/2015 | Rouet |
| 9,111,754 B2 | 8/2015 | Demirlioglu et al. |
| 9,142,543 B2 | 9/2015 | Katakura et al. |
| 9,331,472 B2 | 5/2016 | Huang et al. |
| 9,941,267 B2 | 4/2018 | Tsai |
| 2002/0020873 A1 | 2/2002 | Klodzinski |
| 2003/0108659 A1 | 6/2003 | Bales et al. |
| 2003/0128486 A1 | 7/2003 | Chuang et al. |
| 2004/0257728 A1 | 12/2004 | Hu |
| 2006/0108659 A1 | 5/2006 | Yanagihara et al. |
| 2008/0062595 A1 | 3/2008 | Ping et al. |
| 2008/0080108 A1 | 4/2008 | Lin et al. |
| 2008/0142837 A1 | 6/2008 | Sato et al. |
| 2008/0296618 A1 | 12/2008 | Suh et al. |
| 2009/0065785 A1 | 3/2009 | Beach |
| 2009/0140295 A1 | 6/2009 | Kaya et al. |
| 2009/0166677 A1 | 7/2009 | Shibata et al. |
| 2011/0101370 A1 | 5/2011 | Cheng et al. |
| 2011/0210337 A1 | 9/2011 | Briere |
| 2012/0007049 A1 | 1/2012 | Jeon et al. |
| 2012/0043586 A1 | 2/2012 | Nishimori et al. |
| 2012/0080724 A1 | 4/2012 | Iwabuchi et al. |
| 2013/0088280 A1 | 4/2013 | Lal et al. |
| 2013/0153919 A1 | 6/2013 | Curatola et al. |
| 2014/0084347 A1 | 3/2014 | Salcedo et al. |
| 2014/0183609 A1 | 7/2014 | Takatani et al. |
| 2014/0264453 A1 | 9/2014 | Moens et al. |
| 2014/0327043 A1* | 11/2014 | Kim .............. H01L 29/7787 257/190 |
| 2015/0069615 A1 | 3/2015 | Ohno et al. |
| 2016/0372920 A1 | 12/2016 | Kinzer et al. |
| 2017/0357283 A1 | 12/2017 | Adachi |
| 2018/0026029 A1 | 1/2018 | Lin et al. |
| 2018/0047719 A1 | 2/2018 | Vielemeyer et al. |
| 2018/0151681 A1 | 5/2018 | Lavanga et al. |
| 2018/0158942 A1 | 6/2018 | Shibib et al. |

OTHER PUBLICATIONS

Mantech Conference; May 19, 2014; Denver Colorado, US.

Meneghini, Matteo; Technology and Reliability of Normally-Off GaN HEMTs with p-Type Gate; Energies, MDPI; Journal; Jan. 24, 2017, Basel, CH.

Wuerfle et al., "Reliability issues of Gan based high voltage power devices", Microelectronics and Reliability, Elsevier Science LTD., vol. 51, No. 9, Jul. 5, 2011, Berlin, Germany.

Wuerfl et al., "Reliability issues of Gan based high voltage power devices", Microelectronics and Reliability, Elsevier Science LTD., vol. 51, No. 9, Jul. 5, 2011, Berlin, Germany.

Lee, Finella; The Effects of Gate Metals on the Performance of p-GaN/AlGaN/GaN High Electron Mobility Transistors; CS Mantech Conference; May 19, 2014; Denver Colorado, US.

Hsien-Chin Chiu et al., A high Protection Voltage Dual-Gate GaN HEMT Clamp for Electric Vehicle Application, 2011, IEEE.

Zhixin Wang et al., Development of an Electrostatic Discharge Protection Solution in GaN Technology, Dec. 2013, IEEE Electron Device Letter, vol. 34, No. 12, pp. 1491-1493.

Qiang Cui et al., Development of a New pHMET-Based Electrostatic Discharge Protection Structure, Sep. 2011, IEEE Transactions on Electron Devices, vol. 58, No. 9, pp. 2974-2980.

Shankar Bhawani et al; "ESD Behavior of Al Gan/ Gan Hemi on Si: Physical Insights, Design Aspects, Cumulative Degradation and Failure Analysis", 2017 30th International Conference on VLSID Design and 2017 16th International Conference on Embedded Systems (VLSIS), IEEE, Jan. 7, 2017, pp. 361-365.

\* cited by examiner

HIGH ELECTRON MOBILITY TRANSISTOR ESD PROTECTION STRUCTURES

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing devices and other electronics are switching devices that can turn on and off fast, pass large currents with relatively low on resistance, and/or have large breakdown voltages. Switching device that can turn on and off fast, pass large currents with relatively low on resistance, and/or have large breakdown voltages are commonly used in voltage converter, high-frequency transmitters and receivers, or the like in numerous electronic devices.

An exemplary switching device that can turn on and off fast, pass large currents with relatively low on resistance, and/or have large breakdown voltages is the High Electron Mobility Transistor (HEMT), also known as a Heterostructure Field Effect Transistor (HFET) or Modulation Doped Field Effect Transistor (MODFET). Enhancement HEMTs turn on and conduct between their drain and source terminals in response to a positive voltage between their gate and source terminals above a threshold voltage of the device. The enhancement HEMTs typically turn off in response to voltage between their gate and source terminal below the threshold voltage. A small negative voltage between their gate and source terminals may be applied to reduce leakage current when the enhancement HEMT is off. The HEMT can also be readily damaged by high voltages as the result of over-voltage events. Electrostatic Discharge (EDS) events and the like. Accordingly, there is a need for protection circuits for use with the HEMTs and other similar devices that do not affect the switching operation of the devices.

SUMMARY OF THE INVENTION

The present technology may best be understood by referring to the following description and accompanying drawings that are used to illustrate embodiments of the present technology directed toward High Electron Mobility Transistors (HEMT) with integral Electro Static Discharge (ESD) protection structures. The device can include a multi-gate HEMT including a trigger gate and one or more additional gates configured as diode coupled drain structures.

In one implementation, the device can include a wider-bandgap semiconductor layer disposed on the wide-bandgap semiconductor layer to form a heterojunction, wherein a Two-Dimension Electron Gas (2DEG) channel occurs in the wide-bandgap semiconductor layer proximate a boundary with the wider-bandgap semiconductor layer. A source can be disposed on a first portion of the wider-bandgap semiconductor layer and a drain can be disposed on a second portion of the wider-bandgap semiconductor layer. A first gate can be disposed on a third portion of the wider-bandgap semiconductor layer between the source and the drain. A second gate can be disposed on a fourth portion of the wider-bandgap semiconductor layer between the first gate and the drain and electrically coupled to the drain. Majority carriers in the 2DEG channel proximate the first gate can be depleted by the first gate when a potential voltage less than a first threshold voltage is applied between the first gate and the source. Majority carriers in the 2DEG channel proximate the second gate can be depleted by the second gate when a potential voltage less than a second threshold voltage is applied between the second gate and a fifth portion of the wider-bandgap semiconductor layer between the fourth and third portions of the wider-bandgap semiconductor layer. The second threshold voltage can be greater than or equal to the first threshold voltage.

The device can optionally include one or more additional gates. For example, a third gate can be disposed on a fifth portion of the wider-bandgap semiconductor layer between the first gate and the second gate and can be electrically coupled to a sixth portion of the wider-bandgap semiconductor layer between the second gate and the third gate. The third threshold voltage can also be greater than or equal to the first threshold voltage.

In another implementation, a device can include an Aluminum Gallium Nitride (AlGaN) layer disposed on a Gallium Nitride (GaN) layer. A heterojunction can be established in the GaN layer proximate an interface between the GaN layer and the AlGaN layer. A first conductor can be disposed on a first portion of the AlGaN layer to form a source, and a second conductor can be disposed on a second portion of the AlGaN layer to form a drain. A first GaN region can be disposed on a third portion of the AlGaN layer proximate the heterojunction between the source and the drain to form a first gate. A second GaN region can be disposed on a fourth portion of the AlGaN layer proximate the heterojunction between the first gate the drain to form a second gate. The second gate can be electrically coupled to the drain. A threshold voltage associated with the second gate can be equal to or greater than a threshold voltage associated with the first gate. Again, the device can optionally include one or more additional gates.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
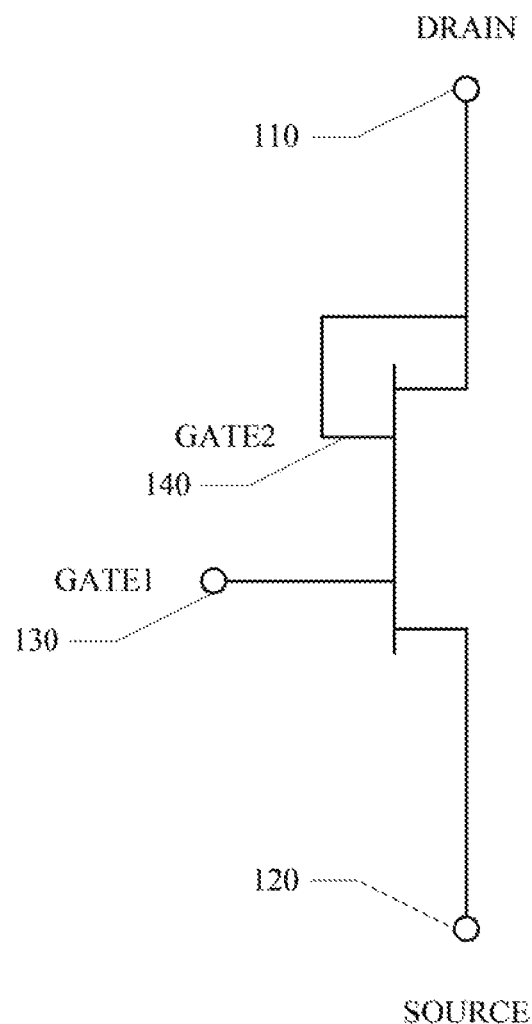
FIG. 1 shows a schematic diagram of an enhancement HEMT, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

FIG. 1 shows a schematic diagram of an enhancement HEMT, in accordance with aspects of the present technology. The HEMT can be employed to as an Electrostatic Discharge (ESD) clamp. The HEMT 100 can include a drain 110, a source 120, a first gate 130 and a second gate 140. A Two-Dimension Electron Gas (2DEG) channel of the HEMT 100 can be disposed between the drain 110 and source 120 of the HEMT 100. The first gate 130 can be disposed proximate the 2DEG channel between the drain 110 and source 120. The first gate 130 can be configured to deplete majority earners in the 2DEG channel proximate the first gate 130 when a potential applied between the first gate 130 and the source 120 is less than a threshold voltage associated with the first gate 130. The second gate 340 can be disposed proximate the 2DEG channel between the drain 110 and the first gate 130. The second gate 140 can be electrically coupled to the drain 110. The second gate 140 can be configured to deplete majority carriers in the 2DEG channel proximate the second gate 140 when a potential between the second gate 140 and the 2DEG channel between the second gate 140 and the first gate 130 is less than a threshold voltage associated with the second gate. The first gate can be referred to as a trigger gate and the second gate can be referred to as a diode coupled drain structure. The threshold voltage associated with the second gate 140 can be equal to or greater than the threshold voltage associated with the first gate 130. In one implementation, the threshold voltages associated with the first and second gates 130, 140 can be approximately 1-2 volts.

When a potential less than the threshold voltage associated with the first gate 130 is applied to the first gate 130 and the majority carriers in the 2DEC channel are depleted proximate the first gate 130, the 2DEC channel docs not conduct current between the source 110 and drain 120 and the HEMT 100 is turned off. When a potential less than the threshold voltage associated with the second gate 140 is applied to the second gate 140 and the majority carriers in the 2DEG channel are depleted proximate the second gate 140, the 2DEC channel does not conduct current between the source 110 and drain 120 and the HEMT 100 is also turned off. When the potentials applied to the first and second gates 130, 140 are greater than the threshold voltages associated with the respective gates 130, 140, the 2DEC channel can conduct current between the source 100 and drain 120 and the HEMT 100 is turned on. When the HEMT 100 is on, substantially all the current flows from the drain 120 to the source 110. Substantially no current flows through the second gate 140 to the source 110.

Under normal operating conditions the enhancement HEMT 100 is turned off. However, under an ESD condition, the depletion regions under the first and second gates are reduced thereby exposing a continuous 2DEG channel between the drain and source to discharging an ESD current from the drain to the source. In addition, the HEMT 100 can withstand a negative potential between the gate and source to reduce power loss due to leakage current through the device, without disrupting the operation of the device. In one implementation, the second gate can be configured to have a depletion layer punch through of about 10 to 12 Volts (V) when a positive potential voltage is applied to the source relative to the drain.

Figure 2:
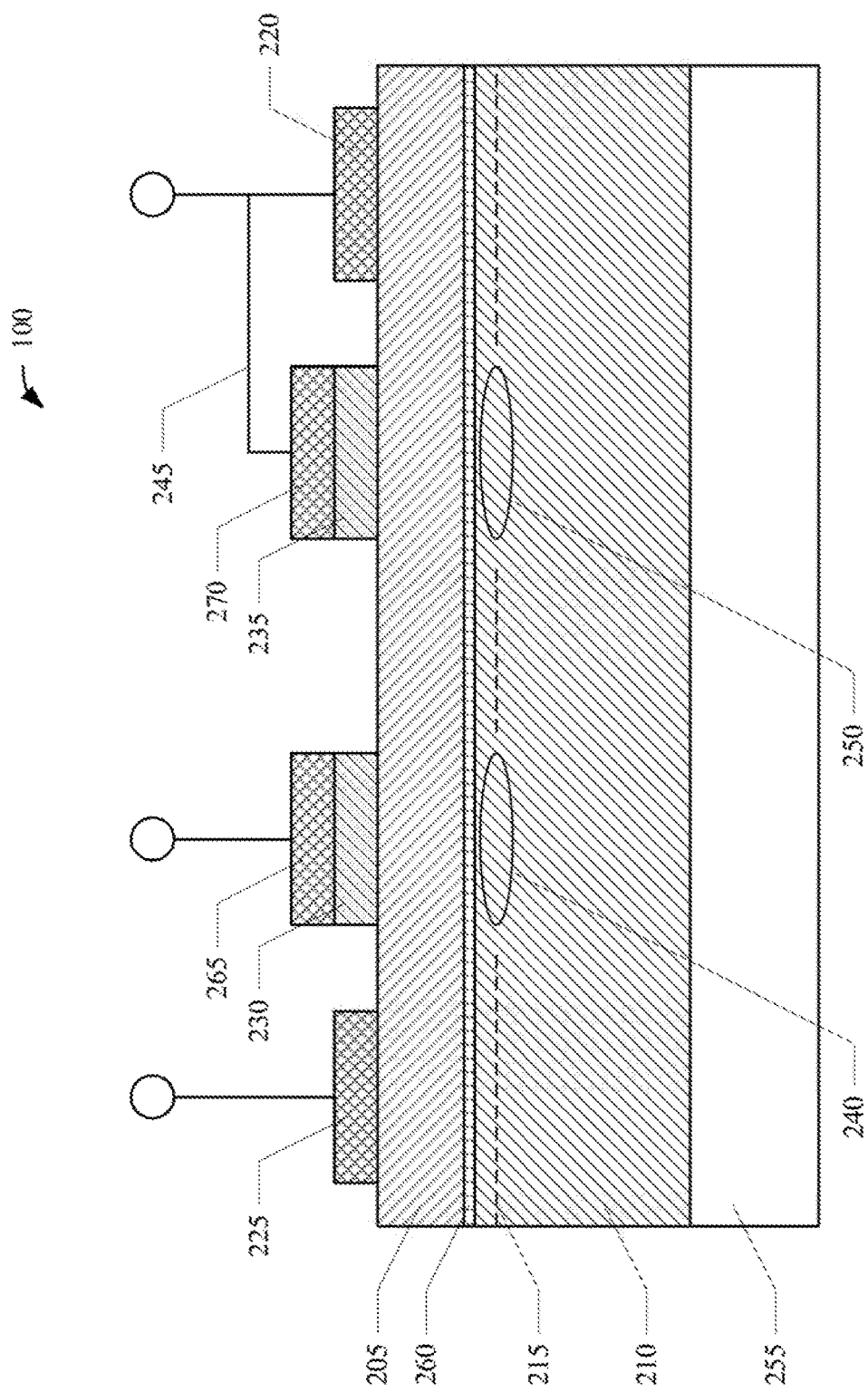
FIG. 2 shows a block diagram of an enhancement HEMT, in accordance with aspects of the present technology.

Referring now to FIG. 2, a block diagram of an enhancement HEMT, in accordance with aspects of the present technology, is shown. The HEMT 100 can include a wider-bandgap semiconductor layer 205 disposed on a wide-bandgap semiconductor 210 to form a heterojunction. The terms 'wide-bandgap' and 'wider-bandgap,' as used herein, describe the bandgap of the respective materials relative to each other. Generally, narrow-bandgap refers to a class of semiconductors like Silicon (Si) and Germanium (G), whereas Gallium Nitride (GaN) can be considered a wide-bandgap semiconductor, and Aluminum Gallium Nitride (AlGaN) can be considered a wider-bandgap semiconductor. The wide-bandgap semiconductor layer 210 can be a substantially intrinsic semiconductor layer. The term 'substantially intrinsic." as used herein, refers to an unintentionally doped semiconductor that can include one or more impurities/dopants that were not intentionally included in the semiconductor. A 2DEG channel 215 can occur in the wide-bandgap semiconductor layer 210 proximate a boundary with the wider-bandgap semiconductor layer 205. In one implementation, the wider-bandgap semiconductor layer 205 can be a group III/V semiconductor compound including a group-III element, and the wide-bandgap semiconductor layer 210 can be a group III/V semiconductor compound. For example, the wide-bandgap semiconductor layer 210 can include Gallium Nitride (GaN) and the wider-bandgap semiconductor layer 205 can include Aluminum Gallium Nitride (AlGaN). The majority carriers in the 2DEG channel 215 can be electrons in the heterojunction formed between an AlGaN layer 205 and a GaN layer 210.

The HEMT 100 can also include a drain 220, a source 225, a first gate 230 and a second gate 235. The source 225 can be disposed on a first portion of the wider-bandgap semiconductor layer 205, and the drain 220 can be disposed on a second portion of the wider-bandgap semiconductor layer 205. In one implementation, the drain 220 and source 225 can include a conductor, such as Titanium (Ti), Titanium Nitride (TiN), Tungsten (W), Titanium Tungsten (TiW), Molybdenum (Mo) or the like, that can form a good ohmic contact with the 2DEG channel 215 through the wider-bandgap semiconductor layer 205. In one implementation, the first and second gates 230, 235 can include a doped group-III/V semiconductor compound. For example, the doped group-III/V semiconductor compound of the first and second gates 330, 335 can include p-doped GaN. In one implementation, the second gate 235 can be spaced from the first gate 230 by approximately 1 micrometers (μm) or less. In one implementation, the channel length of the second gate 235 can be substantially smaller than the channel length of the first gate 230. The channel length of the second gate 235 can be substantially smaller so that the conduction mechanism of the channel of the second gate 235 when the potential voltage at the source 225 is positive by a level at or above a punch-though mechanism set by a drain-induced-barrier-lowering mechanism. The channel length of the second gate 235 can, for example, be adjusted so that a predetermined punch-through voltage of approximately 10 to 12 V is achieved for ESD events.

The first gate 230 can be disposed on a third portion of the wider-bandgap semiconductor layer 205 between the source 225 and the drain 220. Majority carriers in the 2DEG channel 215 proximate the first gate can be depleted 240 by the first gate 230 when a potential voltage less than a first threshold voltage is applied between the first gate 230 and the source 225. The second gate 235 can be disposed on a fourth portion of the wider-bandgap semiconductor layer 205 between the first gate 230 and the drain 220. The second gate 235 can be electrically coupled to the drain 220. The majority carriers in the 2DEG channel 215 proximate the second gate 235 can be depleted 250 by the second gate 235 when a potential voltage less than a second threshold voltage is applied between the second gate 235 and a fifth portion of the wider-bandgap semiconductor layer 205 between the fourth and third portion of the wider-bandgap semiconductor layer 205. The second threshold voltage can be greater than or equal to the first threshold voltage.

The dimensions of the first and second gates 230, 235 can have substantially similar dimensions. For example, the length width and thickness of the p-doped GaN layers 230, 235 can be substantially the same. Similarly, the dimension of the third and fourth portion of the wider-bandgap semiconductor layer 205 proximate the first and second gates 230, 235 can have substantially similar dimensions. For example, the thickness of the AlGaN layer 205 proximate the first and second gates 230, 235 can be substantially uniform. If the HEMT 100 is configured to have first and second threshold voltages that are substantially equal, the concentration of the additional group-III element, such as Aluminum, in the wider-bandgap semiconductor layer 205 proximate the first and second gates 230, 235 can be substantially equal. If the HEMT 100 is configured to have second gate 235 with an associated second threshold voltage that is greater than a first threshold voltage associated with the first gate 230, the concentration of the additional group-III element, such as Aluminum, in the wider-bandgap semiconductor layer 205 proximate the second gate 235 can be greater than in the wider-bandgap semiconductor layer 205 proximate the first gate 230.

When a potential less than the threshold voltage associated with the first gate 230 is applied to the first gate 230 and the majority carriers in the 2DEC channel are depleted proximate the first gate 230, the 2DEC channel cannot conduct current between the drain 220 and the source 225 and the HEMT 100 is turned off. When a potential less than the threshold voltage associated with the second gate 235 is applied to the second gate 235 and the majority carriers in the 2DEC channel are depleted proximate the second gate 235, the 2DEC channel cannot conduct current between the drain 220 and source 225 and the HEMT 100 is also turned off. When the potentials applied to the first and second gates 230, 235 are greater than the threshold voltages associated with the respective gates 230, 235, the 2DEC channel can conduct current between the drain 220 and the source 225 and the HEMT 100 is turned on.

Under normal operating conditions the enhancement HEMT 100 is turned off. However, under an ESD condition, the depletion regions under the first and second gates are reduced thereby exposing a continuous 2DEG channel between the drain and source for discharging an ESD current. In addition, the HEMT 100 can withstand a negative potential between the gate and source to reduce power loss due to leakage current through the device, without disrupting the operation of the device.

The HEMT 100 can also include a substrate 255 upon which the wide-bandgap semiconductor layer 210 can be formed. In one implementation, the substrate can be a silicon, silicon carbide or similar substrate, which can provide for case of forming the wide-bandgap semiconductor layer 210 by methods such as epitaxial deposition. The HEMT 100 can optionally include a lattice transition layer 260 between the wider-bandgap semiconductor layer 205 and the wide-bandgap semiconductor layer 210 to reduce lattice mismatch between the two layers. In one implementation, the lattice transition layer 260 can include an Aluminum Nitride (AlN) layer. The HEMT 100 can also include a first gate contact 265 disposed on the first gate 230, and a second gate contact 270 disposed on the second gate 235. In one implementation, the first gate contact 265 and second gate contact 270 can include a conductor, such as Titanium (Ti), Titanium Nitride (TiN), Tungsten (W), Titanium Tungsten (TiW), Molybdenum (Mo) or the like, that can form a good ohmic contact to the respective first gate 230 and second gate 235. The HEMT 100 can also include numerous other layers, regions, structures, elements and the like know to those in the art or would be obvious to those skilled in the art to combine with aspect of the present technology. However, because such other layers, regions, structures, elements and the like are not germane to an understanding of aspects of the present technology they are not described herein.

Embodiments of the HEMT 100 device are compatible with GaN and GaN on Silicon (Si), and therefore can be integrated in circuits fabricated using GaN or GaN on Si device technologies. The HEMT 100 can therefore be readily employed as an ESD clamp in GaN and/or GaN on Si technology-based circuits.

Figure 3:
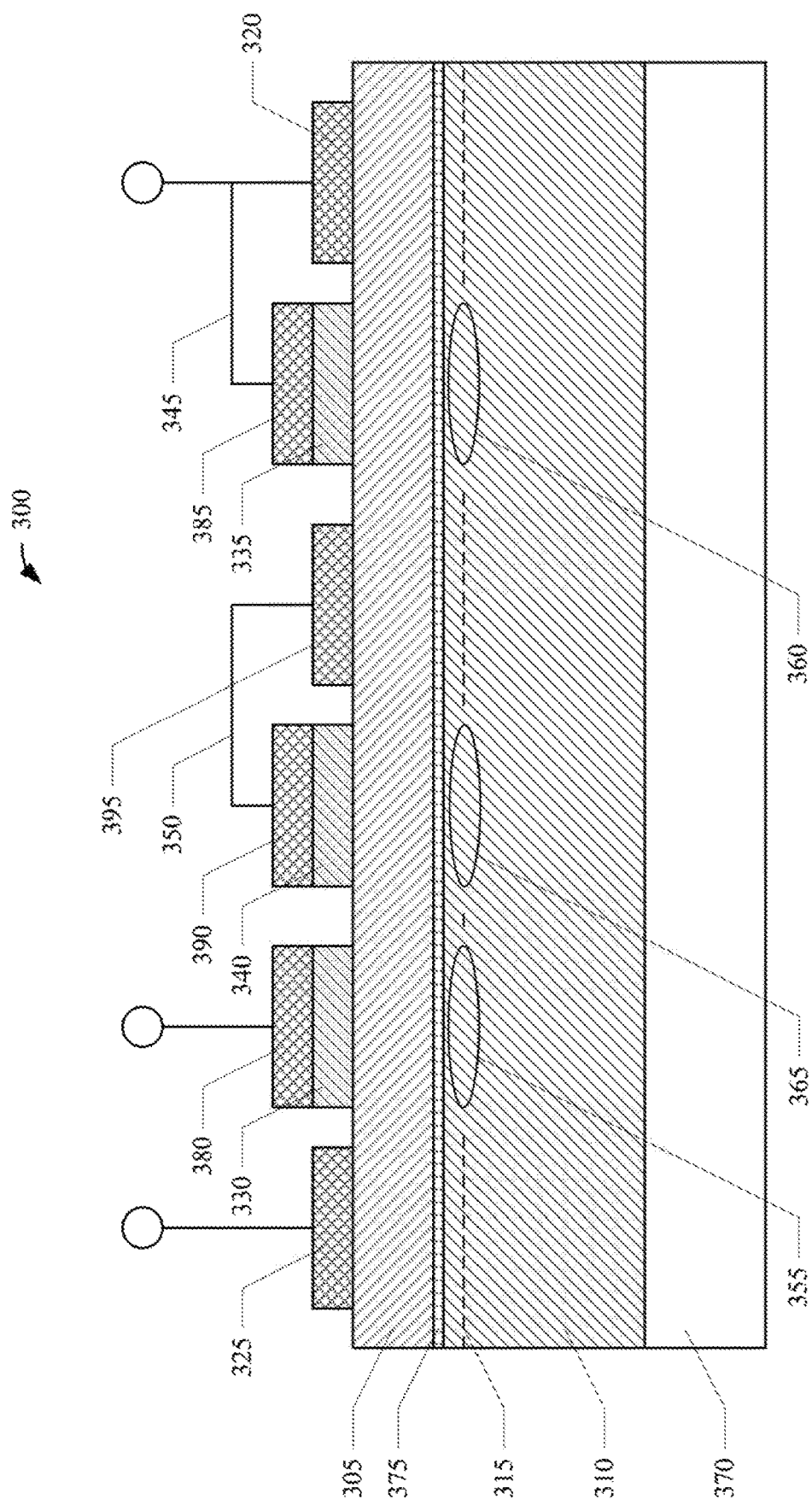
FIG. 3 shows a block diagram of on enhancement HEMT, in accordance with aspects of the present technology.

In aspects, the HEMT can include multiple additional gates. Referring now to FIG. 3, a block diagram of an enhancement HEMT, in accordance with aspects of the present technology, is shown. The HEMT 300 can include a wider-bandgap semiconductor layer 305 disposed on a wide-bandgap semiconductor 310 to form a heterojunction. The wide-bandgap semiconductor layer 310 can be a substantially intrinsic semiconductor layer. A 2DEG channel 315 can occur in the wide-bandgap semiconductor layer 310 proximate a boundary with the wider-bandgap semiconductor layer 305. In one implementation, the wider-bandgap semiconductor layer 305 can be a group III/V semiconductor compound including a group-III element, and the wide-bandgap semiconductor layer 310 can be a group III/V semiconductor compound. For example, the wide-bandgap semiconductor layer 310 can include Gallium Nitride (GaN) and the wider-bandgap semiconductor layer 305 can include Aluminum Gallium Nitride (AlGaN). The majority carriers in the 2DEG channel 315 can be electrons in the heterojunction formed between an AlGaN layer 305 and a GaN layer 310.

The HEMT 300 can also include a drain 320, a source 325, a first gate 330, a second gate 335 and a third gate 340. The source 325 can be disposed on a first portion of the wider-bandgap semiconductor layer 305, and the drain 320 can be disposed on a second portion of the wider-bandgap semiconductor layer 305. In one implementation, the drain 320 and source 325 can include a conductor, such as Titanium (Ti), Titanium Nitride (TiN), Tungsten (W), Titanium Tungsten (TiW), Molybdenum (Mo) or the like, that can form a good ohmic contact with the 2DEG channel 315 through the wider-bandgap semiconductor layer 305. In one implementation, the first and second gates 330, 335 can include a doped group-III/V semiconductor compound. For example, the doped group-III/V semiconductor compound of the first and second gates 330, 335 can include p-doped GaN.

The first gate 330 can be disposed on a third portion of the wider-bandgap semiconductor layer 305 between the source 325 and the drain 320. The second gate 335 can be disposed on a fourth portion of the wider-bandgap semiconductor layer 305 between the first gate 330 and the drain 320. The second gate 335 can be electrically coupled 345 to the drain 320. The third gate 340 can be disposed on a fifth portion of the wider-bandgap semiconductor layer 305 between the first gate 330 and the second gate 335. The third gate 340 can be electrically coupled 350 to a sixth portion of the wider-bandgap semiconductor layer 305 between the second gate 335 and the third gate 340. Majority carriers in the 2DEG channel 315 proximate the first gate 330 can be depleted 355 by the first gate 330 when a potential voltage less than a first threshold voltage is applied between the first gate 330 and the source 325. The majority carriers in the 2DEG channel 315 proximate the second gate 335 can be depleted 360 by the second gate 335 when a potential voltage less than a second threshold voltage is applied between the second gate 335 and the third gate 340. The majority carriers in the 2DEG channel proximate the third gate 340 can be depleted 365 by the third gate 340 when a potential voltage less than a third threshold voltage applied between the third gate 340 and the first gate 330. The second threshold voltage and third threshold voltage can be greater than or equal to the first threshold voltage. The HEMT 300 can include any number of additional gates configured similar to the third gate 340.

The dimensions of the first, second and third gates 330, 335, 340 can have substantially similar dimensions. For example, the length width and thickness of the p-doped GaN layers 330, 335, 340 can be substantially the same. Similarly, the dimension of the third, fourth and fifth portion of the wider-bandgap semiconductor layer 305 proximate the first second and third gates 330, 335, 340 can have substantially similar dimensions. For example, the thickness of the AlGaN layer 305 proximate the first, second and third gates 330, 335, 340 can be substantially uniform. If the HEMT 300 is configured to have first, second and third threshold voltages that are substantially equal, the concentration of the additional group-III element, such as Aluminum, in the wider-bandgap semiconductor layer 305 proximate the first, second and third gates 330, 335, 340 can be substantially equal. If the HEMT 300 is configured to have second gate 335 and/or third gate 340 with an associated second and/or third threshold voltage that is greater than a first threshold voltage associated with the first gate 330, the concentration of the additional group-III element, such as Aluminum, in the wider-bandgap semiconductor layer 305 proximate the second and third gates 335, 340 can be greater than in the wider-bandgap semiconductor layer 305 proximate the first gate 330.

When a potential less than the threshold voltage associated with the first gate 330 is applied to the first gate 330 and the majority carriers in the 2DEC channel are depleted proximate the first gate 330, the 2DEC channel cannot conduct current between the drain 320 and the source 325 and the HEMT 300 is turned off. When a potential less than the threshold voltage associated with the second gate 335 is applied to the second gate 335 and the majority carriers in the 2DEC channel are depleted proximate the second gate 335, the 2DEC channel cannot conduct current between the drain 320 and source 325 and the HEMT 300 is also turned off. When a potential less than the threshold voltage associated with the third gate 340 is applied to the third gate 340 and the majority carriers in the 2DEC channel are depleted proximate the third gate 340, the 2DEC channel cannot conduct current between the drain 320 and source 325 and the HEMT 300 is also turned off. When the potentials applied to the first, second and third gates 330, 335, 340 are greater than the threshold voltages associated with the respective gates 330,335, 340 the 2DEC channel can conduct current between the drain 320 and the source 325 and the HEMT 300 is turned on.

Under normal operating conditions the enhancement HEMT 300 is turned off. However, under an ESD condition, the depletion regions under the first, second and third gates are reduced thereby exposing a continuous 2DEG channel between the drain and source to discharging an ESD current. In addition, the HEMT 300 can withstand a negative potential between the gate and source to reduce power loss due to leakage current through the device, without disrupting the operation of the device.

The HEMT 300 can also include a substrate 370 upon which the wide-bandgap semiconductor layer 310 can be formed. In one implementation, the substrate 370 can be a silicon, silicon carbide or similar substrate, which can provide for ease of forming the wide-bandgap semiconductor layer 310 by methods such as epitaxial deposition. The HEMT 300 can optionally include a lattice transition layer 375 between the wider-bandgap semiconductor layer 305 and the wide-bandgap semiconductor layer 310 to reduce lattice mismatch between the two layers. In one implementation, the lattice transition layer 375 can include an Aluminum Nitride (AlN) layer. The HEMT 300 can also include a first gate contact 380 disposed on the first gate 330, a second gate contact 385 disposed on the second gate 335, a third gate contact 385 disposed on the third gate 340, and a body contact 395 for coupling the third gate 340 to the wider-bandgap semiconductor layer 305 between the second gate 335 and the fourth gate 340. In one implementation, the first, second and third gate contacts 380, 385, 390 and the body contact 395 can include a conductor, such as Titanium (Ti), Titanium Nitride (TiN), Tungsten (W), Titanium Tungsten (TiW), Molybdenum (Mo) or the like, that can form a good ohmic contact to the respective first, second and third gates 330, 335, 340 and the wider-bandgap semiconductor layer 305. The HEMT 300 can also include numerous other layers, regions, structures, elements and the like know to those in the art or would be obvious to those skilled in the art to combine with aspect of the present technology. However, because such other layers, regions, structures, elements and the like are not germane to an understanding of aspects of the present technology they are not described herein.

Embodiments of the HEMT 300 device are compatible with GaN and GaN on Silicon (Si), and therefore can be integrated in circuits fabricated using GaN or GaN on Si device technologies. The HEMT 300 can therefore be readily employed as an ESD clamp in GaN and/or GaN on Si technology-based circuits.

The foregoing descriptions of Specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A device comprising:
a wide-bandgap semiconductor layer;
a wider-bandgap semiconductor layer disposed on the wide-bandgap semiconductor layer to form a heterojunction, wherein a Two-Dimension Electron Gas (2DEG) channel occurs in the wide-bandgap semiconductor layer proximate a boundary with the wider-bandgap semiconductor layer;
a source disposed on a first portion of the wider-bandgap semiconductor layer;
a drain disposed on a second portion of the wider-bandgap semiconductor layer;
a first gate disposed on a third portion of the wider-bandgap semiconductor layer between the source and the drain, wherein majority carriers in the 2DEG channel proximate the first gate are depleted by the first gate when a potential voltage less than a first threshold voltage is applied between the first gate and the source;
a second gate disposed on a fourth portion of the wider-bandgap semiconductor layer between the first gate and the drain, wherein the second gate and drain are electrically coupled together to be at the same potential voltage, and wherein majority carriers in the 2DEG channel proximate the second gate are depleted by the second gate when a potential voltage less than a second threshold voltage is applied between the second gate and a fifth portion of the wider-bandgap semiconductor layer between the fourth and third portions of the wider-bandgap semiconductor layer, and
wherein the second threshold voltage is greater than or equal to the first threshold voltage.

2. The device of claim 1, wherein the wide-bandgap semiconductor layer comprises a un-intentionally doped semiconductor layer.

3. The device of claim 1, further comprising:
a third gate disposed on a fifth portion of the wider-bandgap semiconductor layer between the first gate and the second gate and electrically coupled to a sixth portion of the wider-bandgap semiconductor layer between the second gate and the third gate.

4. The device of claim 1, wherein the second threshold voltage is equal to the first threshold voltage.

5. The device of claim 1, wherein the second threshold voltage is greater than the first threshold voltage by a predetermined amount.

6. The device of claim 1, wherein:
the wide-bandgap semiconductor layer comprises a intrinsic Gallium Nitride (GaN) layer;
the wider-bandgap semiconductor layer comprises an Aluminum Gallium Nitride (AlGaN) layer; and
the first and second gates comprise p-doped Gallium Nitride (GaN).

7. The device of claim 1, wherein:
the first and second gates have similar dimensions; and
the third and fourth portions of the wider-bandgap semiconductor layer have similar dimensions.

8. A device comprising:
a first Gallium Nitride (GaN) based semiconductor region;
a second GaN based semiconductor region having a wider band gap than the first GaN based semiconductor region, the second GaN based semiconductor region disposed on the first GaN based semiconductor region wherein a heterojunction is established at an interface between the first GaN based semiconductor region and the second GaN based semiconductor region;
a first conductor disposed on a first portion of the second GaN based semiconductor region to form a source;
a second conductor disposed on a second portion of the second GaN based semiconductor region to form a drain;
a third GaN based semiconductor region disposed on a third portion of the second GaN based semiconductor region proximate the heterojunction between the source and the drain to form a first gate; and
a fourth GaN base semiconductor region disposed on a fourth portion of the second GaN based semiconductor region proximate the heterojunction between the first gate and the drain to form a second gate, wherein the second gate is electrically coupled to the drain to be at the same potential voltage, and wherein a threshold voltage associated with the second gate is equal to or greater than a threshold voltage associated with the first gate.

9. The device of claim 8, further comprising:
a silicon substrate upon which the first GaN based semiconductor region is disposed.

10. The device of claim 9, further comprising:
one or more lattice transition regions disposed between the silicon substrate and the first GaN based semiconductor region.

11. The device of claim 8, further comprising:
a fifth GaN based semiconductor region disposed on a fifth portion of the second GaN based semiconductor region proximate the heterojunction between the first gate and the second gate to form a third gate, wherein the third gate is electrically coupled to a sixth portion of the second GaN based semiconductor region between the third gate and the second gate, and wherein a threshold voltage associated with the third gate is equal to or greater than the threshold voltage associate with the first gate.

12. The device of claim 8, wherein the threshold voltage associated with the second gate is equal to the threshold voltage associated with the first gate.

13. The device of claim 8, wherein the threshold voltage associated with the second gate is greater than the threshold voltage associated with the first gate by a predetermined amount.

14. The device of claim 8, wherein:
the third and fourth GaN based semiconductor regions have similar dimensions; and
the third and fourth portions of the second GaN based semiconductor layer have similar dimensions.

15. The device of claim 8, wherein:
majority carriers in the heterojunction proximate the first gate are depleted when a potential voltage less than the threshold voltage associated with the first gate is applied between the first gate and the source; and
majority carriers in the heterojunction proximate the second gate are depleted when a potential voltage less than the threshold voltage associated with the second gate is applied between the second gate and a fifth portion of the second GaN based semiconductor layer disposed between the first and second gates.

16. A device comprising:
a drain;
a source;
a Two-Dimension Electron Gas (2DEG) channel between the drain and the source;
a first gate disposed proximate the 2DEG channel between the drain and source, wherein the first gate is configured to deplete majority carriers in the 2DEG channel proximate the first gate when a potential applied between the first gate and the source is less than a threshold voltage associated with the first gate;
a second gate disposed proximate the 2DEC channel between the drain and the first gate, wherein the second gate and drain are electrically coupled to be at the same potential voltage, and wherein the second gate is configured to deplete majority carriers in the 2DEG channel proximate the second gate when a potential applied between the second gate and the 2DEG channel between the second gate and the first gate is less than a threshold voltage associated with the second gate; and
wherein the threshold voltage associated with the second gate is equal to or greater than the threshold voltage associated with the first gate.

17. The device of claim 16, further comprising:
a first layer of a group-III/V semiconductor compound; and
a second layer of a group-III/V semiconductor compound including a group-III element, wherein the 2DEG channel occurs in the first layer proximate an interface between the first layer and the second layer.

18. The device of claim 17, wherein:
the group-III/V semiconductor compound of the first layer comprises Gallium Nitride (GaN); and
the group-III/V semiconductor compound including a group-III element of the second layer comprises Aluminum Gallium Nitride (AlGaN).

19. The device of claim 17, wherein first and second gates comprise a group-III/V semiconductor compound.

20. The device of claim 19, wherein the first and second gates comprise p-doped Gallium Nitride (GaN).

21. The device of claim 17, wherein the second layer is disposed between the first and second gates and the first layer.

22. The device of claim 16, wherein dimensions of the first and second gates are similar.

23. The device of claim 17, wherein dimensions of the second layer proximate the first and second gates are similar.

* * * * *